United States Patent
Park et al.

(10) Patent No.: US 6,987,198 B2
(45) Date of Patent: Jan. 17, 2006

(54) ACID GENERATOR AND THIN FILM COMPOSITION CONTAINING THE SAME

(75) Inventors: Joo Hyeon Park, Chonan-si (KR); Joung Bum Lee, Asan-si (KR); Seong Ju Kim, Asan-si (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 142 days.

(21) Appl. No.: 10/421,490

(22) Filed: Apr. 22, 2003

(65) Prior Publication Data

US 2003/0216495 A1 Nov. 20, 2003

(30) Foreign Application Priority Data

May 2, 2002 (KR) ..................... 10-2002-0024082

(51) Int. Cl.
C07C 303/00 (2006.01)
C07C 307/00 (2006.01)
C07C 309/00 (2006.01)
C07C 311/00 (2006.01)

(52) U.S. Cl. .............................. 558/44; 558/51; 558/56
(58) Field of Classification Search ................. 558/44, 558/51, 56, 41
See application file for complete search history.

(56) References Cited

U.S. PATENT DOCUMENTS 6,165,684 A 12/2000 Mizutani et al.

(Continued)

FOREIGN PATENT DOCUMENTS

JP 2001-60004 * 3/2001

OTHER PUBLICATIONS

Madrid et al, "Experimental and computational study of the participation of stereoelectronic effects in 2-substituted norbornane derivatives by 1JC-C coupling constants" Revista de la Sociedad Quimica de Mexico, vol. 44(1), pp. 53-61 (2000), As Abstracted by Caplus.*

(Continued)

Primary Examiner—James O. Wilson
Assistant Examiner—Zachary C. Tucker
(74) Attorney, Agent, or Firm—Squire, Sanders & Dempsey

(57) ABSTRACT

The present invention relates to the compounds generating strong acids (described hereafter as "acid generators") decomposed by heat and the composition of thin film containing the same. Provided are the compounds represented by the structure of formula I and the composition containing the compounds.

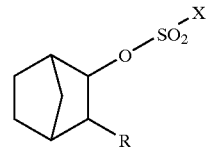

[Formula I]

wherein X is alkyl or aryl group and R is hydrogen atom, hydroxy, alkoxy or alkyl group.

The abovementioned acid generators of the present invention generate acid by heat at relatively low temperatures, preventing the change in the ratio of the composition due to evaporation of some components in the composition. Accordingly, it has the advantageous effect that the ratio of components in the composition is controlled and the preparation of the thin film with the wanted properties is simplified.

2 Claims, 1 Drawing Sheet

U.S. PATENT DOCUMENTS

| | | | |
|---|---|---|---|
| 6,277,750 | B1 | 8/2001 | Pawlowski et al. |
| 6,399,269 | B2 | 6/2002 | Mizutani et al. |
| 6,503,689 | B2 | 1/2003 | Zampini et al. |
| 6,515,073 | B2 | 2/2003 | Sakamoto et al. |
| 6,576,681 | B2 | 6/2003 | Zampini et al. |
| 6,610,457 | B2 | 8/2003 | Kim et al. |
| 6,610,609 | B2 | 8/2003 | Rutter, Jr. et al. |

OTHER PUBLICATIONS

Kleinfelter and Miller, "Acetolysis of Some Cyclohexylnorbornyl Tosylates and the Case for Dipolar Effects in Cis-Exo Norbornanes" J. Org. Chem. vol. 38(24), pp. 4142-4147 (1973).*

Berson et al, "The Chemistry of Methylnorbornyl Cations. IV. Ratios of Rates of Nucleophile Capture of the Cations at Wagner-Meerwein-Related Sites" J. Am. Chem. Soc., vol. 89(11), pp. 2573-2580 (1967).*

Creary and Rollin "Rearrangement of $\alpha$-Hydroxy Ketals and Derivatives of $\alpha$-Hydroxy Ketals" J. Org. Chem., vol. 42 (26), pp. 4231-4238 (1977).*

* cited by examiner

ACID GENERATOR AND THIN FILM COMPOSITION CONTAINING THE SAME

PRIORITY REFERENCE TO PRIOR APPLICATION

This application claims benefit under 35 U.S.C. §119 of Korean patent application number 10-2002-0024082, entitled "New Acid Generator and Thin Film Composition Containing the Same," filed on May 2, 2002, by inventors Joo Hyeon Park, Joung Bum Lee, and Seong Ju Kim.

BACKGROUND OF THE INVENTION

1. Field of the Invention

The present invention relates to the compounds generating strong acids (described hereafter as "acid generators"), decomposed by heat and the composition of thin films containing the same. Particularly, the present invention relates to the composition which maintains the thin film notwithstanding the severe condition because of the cross linking reaction carried out by the generated acid.

2. Description of the Related Arts

In recent years, great interests are shown on the thin film as the industrial sectors develop rapidly. The thin film technology is used in the processes of ultra fine semiconductors as well as in the household electronic products and furniture. For example, an organic thin film composition is used in the manufacturing process of semiconductor to shield the reflection of light from the bottom layer and to increase the adhesive strength to the substrate. In case it is not shielded, deformation in the ultra fine pattern occurs. When the substrate coated by thin film is exposed to the ArF eximer laser, the light of 193 nm wave length is reflected by the substrate, making the patterns change. The thin film technology is utilized also in the manufacturing process of LCD, to protect the top part of the color filter and the thin film is used as a means to protect the surface of the household electronic products and the furniture.

The technology of making thin films is categorized into two methods according to the catalyst employed. One method is the technology using radical initiator. The frequently used resin in this case is acrylate derivatives. The functional group participating in the reaction is the unreacted acrylate. The other method is the technology using cation catalyst in making the thin films. The resin generally used in the process is the acrylates derivatives containing epoxy group. The epoxy group easily goes into cross linking reaction by strong acids.

The technology using radical initiator to make the thin films has to be blocked from oxygen in the air, making the process problematic, while the technology of using cation catalyst has the advantage of not needing the oxygen blockade.

The cation catalysts are grouped into the compounds according to their characteristics whether generation of acid is by light or by heat. The compounds generating acid by light include iodonium salts, sulfonium salts, phosphonium salts, diazonium slats, pyridinium salts and amides. The compound generating acid by heat includes sec-alkyl-p-toluenesulfonate.

The acid generators by heat or light has to possess both appropriate stability and the property of decomposing by heat according to the uses. When the acid generator decomposes easily by heat or during storage period, it loses the product value, while it also loses the product value when it is too stable to heat because it lacks in reactivity.

SUMMARY OF THE INVENTION

The present invention is to provide novel acid generators which are stable during the long storage period and under the intended temperature in consideration of the above needs.

Other object of the present invention is to provide the composition containing the abovementioned novel acid generators.

These objects of the present invention are accomplished by the novel acid generators represented by the structure of the following formula I.

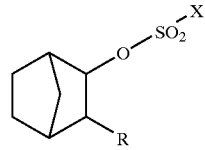

[Formula I]

wherein X is alkyl or aryl group and R is hydrogen atom, hydroxy group, alkoxy group or alkyl group.

BRIEF DESCRIPTION OF THE DRAWINGS

The above and other objects, features and other advantages of the present invention will be more clearly understood from the following detailed description taken in conjunction with the accompanying drawing, in which.

DESCRIPTION OF THE PREFERRED EMBODIMENTS

Figure 1:
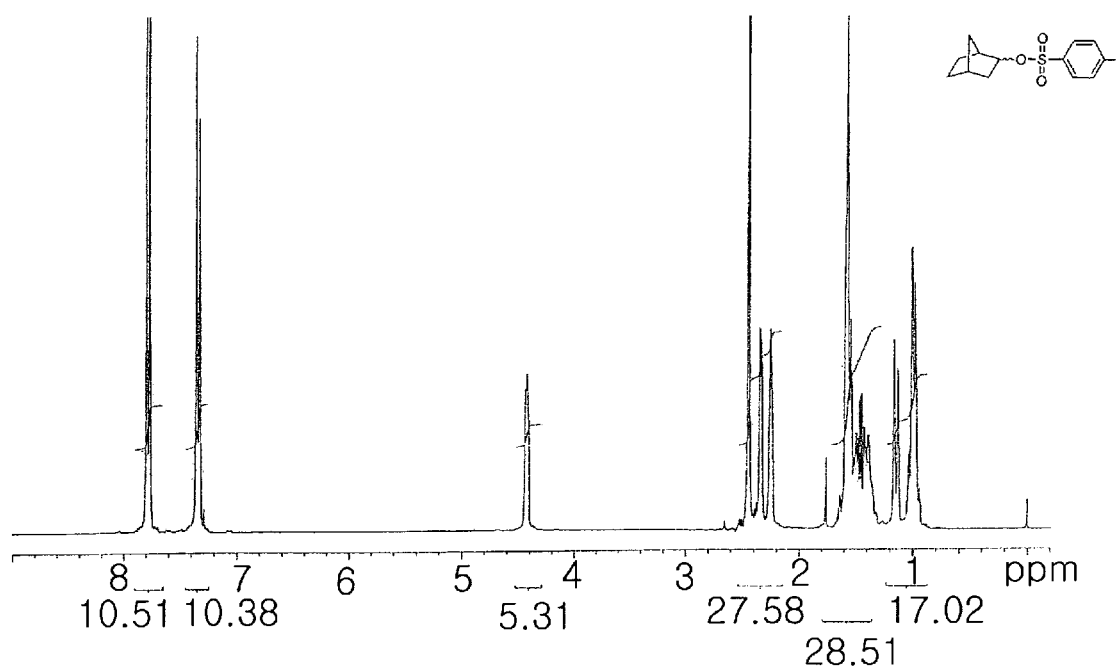
FIG. 1 is the NMR diagram of the novel acid generator of the present invention.

In the following is the illustration of the general properties of the acid generators, exhibited by the compound of the chemical formula I which is the acid generator of formula I wherein X is toluene group.

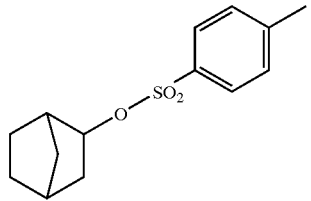

[Chemical Formula I]

When heat or acid is added to the compound represented by the chemical formula I, decomposition reaction occurs around 110° C. and the mechanism of decomposition is as in the following reaction scheme I.

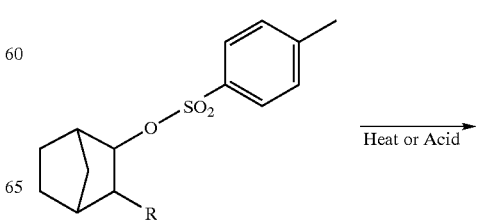

[Reaction scheme I]

-continued

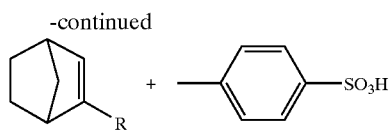

The compound of the chemical formula I is decomposed by heat into olefin and toluenesulfonic acid. The generated toluenesulfonic acid having functions as a strong acid in the thin film composition. The FIG. 1 is NMR(nuclear magnetic resonance) diagram which identifies the structure of the chemical formula I.

The conventionally used sec-alkyl-p-toluenesulfonate has the higher decomposition temperature of 150° C. Because of this high temperature, it has shortcomings in that the volatile components of the thin film composition evaporate easily.

The major constituents of the thin film composition including the above acid generator are the compounds which have the functional group reacting in the cross linking reaction(described hereafter as "cross linking agent"), acid generator, resin, some additive and the solvent dissolving these materials.

Cross Linking Agent

A cross linking agent is a modifier of the original property of a compound by the reaction with acid, light or radical initiator. Examples are the compounds represented by the structure of the general formula II, III and IV.

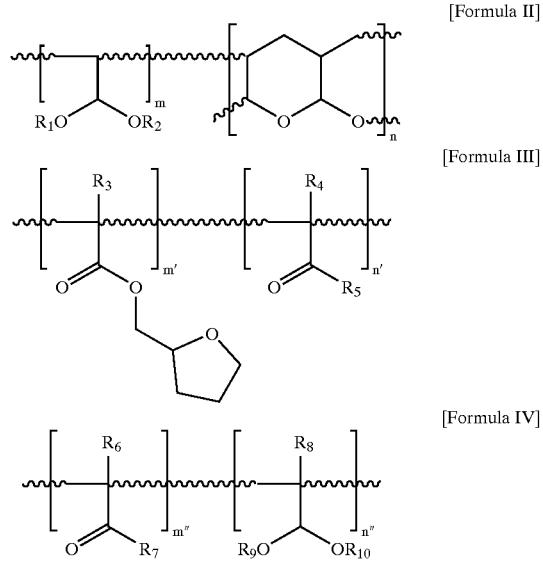

[Formula II]

[Formula III]

[Formula IV]

In the formula II, R1 and R2 both are alkyls and m/(m+n) is in the range of 0.3 to 0.8.

In the formula III, R3 and R4 are all hydrogen atoms or alkyl groups, R5 is hydrogen atom, alkoxy group, hydroxyalkyl epoxyalkyl group, alkoxyalkyl group or hydroxy group and m'/(m'+n') is in the range of 0.2 to 1.0.

In the formula IV, R6 and R8 are hydrogen atom or methyl group, R7 is hydrogen atom, alkoxy group, hydroxyalkyl epoxyalkyl group, alkoxyalkyl group or hydroxy group, R9 and R10 are alkyl groups and m"/(m"+n") is in the range of 0.2 to 1.0.

The compound represented by the formula II is the resin of acrolein polymer, part of which is acetalized by alcohol. This compound produces high molecular compounds by going into cross linking reaction with alcohol or phenol under the acid catalyst.

The compound represented by the formula III is easily synthesized by usual radical reaction. The compound goes into cross linking reaction with tetrahydrofurfuryl group. The functional group proceeds into cross linking reaction by opening the ring under the strong acid catalysts. The cross linking reaction either proceeds alone or with alcohols or phenols.

The compound represented by the formula IV is a modified acrolein polymer copolymerized with other monomer to improve its shortcoming of solubility in general solvents. This polymer and the intermediate have the advantage of good solubility.

Acid Generator

The acid generators are grouped into two categories of generating acid by either heat or light according to molecular characteristics. The compounds generating acid by light include onium types such as iodonium salts, sulfonium salts, phosphonium salts, diazonium slats, pyridinium salts and amides. The other kind of compound generating acid by heat includes sec-alkyl-p-toluenesulfonate. Acid generators either by heat or light are used according to different kinds of thin films. It is better to use the acid generator by light when there is the chance of deformation by heat. But the onium type has disadvantage of being expensive. In some cases, solubility of the composition decreases.

The novel acid generators of the present invention, represented by the following formula I, have appropriate stability and reactivity under heat.

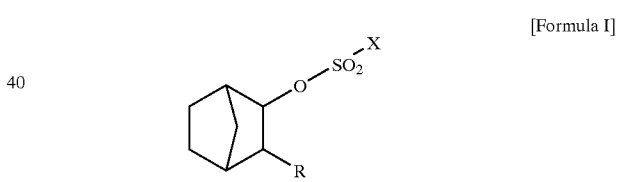

[Formula I]

wherein R is hydrogen atom, hydroxy, alkoxy or alkyl group.

The characteristics of the compounds are in that they are soluble in almost all organic solvents and have easy manufacturing process, providing low cost thin films. Another advantage is that, due to the property of norbornene, the compounds generate acid at a low temperature, compared with other secondary alkyl group(for example, cyclohexyl, isopropyl and cyclopentyl group). The temperature of acid generation for usual secondary alky group is at around 150° C. while that of norbornanyl group is at around 110° C. The temperature of acid generation is important because at the temperature more that 130° C., the volatile components such as low molecular additives, evaporate, degrading the properties of the thin film.

The acid generators described above are synthesized by reacting olefin and epoxy compounds with alkyl sulfonic acid or aryl sulfonic acid. The detailed synthetic method is described in the examples of synthesis. The schematic reaction route is illustrated in the following.

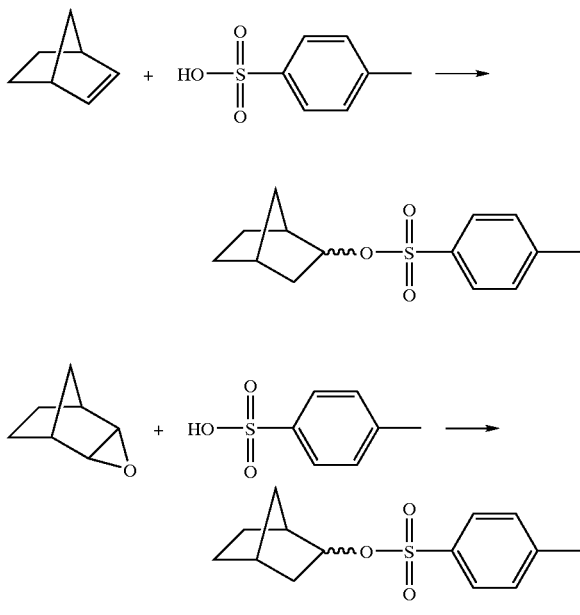

The reaction between norbornene and toluenesulfonic acid proceeds very slowly and the temperature has to be raised to around 70° C. But the reaction with expoxide compound proceeds very rapidly at around 0° C. Both compounds are used after recrystalization in usual organic solvent after termination of the reactions. The thin films are readily manufactured with these compounds, yet for the specific properties and specific use of the thin film, small amount of onium types such as iodonium salts, sulfonium salts, phosphonium salt, diazonium salts, pyridinium salts and amides are added.

Resin and Additives

When the cross linking agent is resin itself, another resin is not needed according to the use. But for the optimization of the wanted properties, addition of another resin is required. For example for the bottom anti-reflective coating in the manufacturing process of semiconductor, specific compounds or resins absorbing UV light are used. In order to absorb UV light of 193 nm wave length, the resins or compounds substituted with aromatic functional groups are used and for the UV light of 248 nm wave length, anthracene substituted resins and compounds are used. The resins absorbing UV light of 193 nm wave length are polyhydroxystyrene, polyacrylate or polystyrene.

For additives, utilized are a plasticizer for controlling the strength of the thin film, polyhydroxy or epoxy compounds for the effective proceeding of the cross linking reaction, surfactant for uniformity of the thin film and homogenous mixing of the solution and light induced acid generator of onium types such as iodonium salts, sulfonium salts, phosphonium salt, diazonium salts, pyridinium salts and amides when the composition is used for the anti-reflective layer.

For the homogeneous and smooth coating layer by the thin film composition, solvents with appropriate evaporation velocity and viscosity are used to make solution. Such solvents include ethyleneglycol monmethyl ether, ethyleneglycol monoethyl ether, ethyleneglycol monopropyl ether, methylcellosolve acetate, ethylcellosolve acetate, propyleneglycol monomethyl ether acetate, propyleneglycol monoethyl ether acetate, propyleneglycol monopropyl ether acetate, methyl isopropyl ketone, cyclohexanone, methyl 2-hydroxypropionate, ethyl 2-hydroxypropionate, 2-heptanone, ethyl lactate or γ-butyrolactone. In some cases, mixtures of more than two of these compounds are used. The amount of solvents are controlled appropriately to have homogeneity of the solution in consideration of the evaporation and viscosity of the solvent.

The following examples are a detailed description of the present invention. The examples are presented for illustrative purposes only and are not intended as a restriction on the scope of the present invention.

Synthesis 1—Synthesis of the Acid Generator Represented by the Structure of formula I

[Formula I]

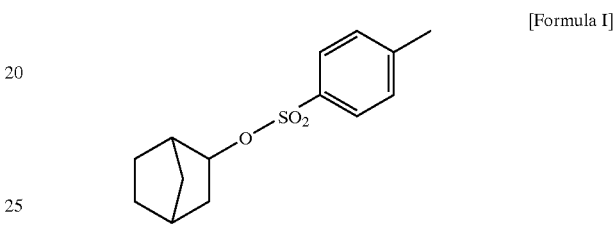

100 g of norbornene and 100 g of toluenesulfonic acid were added into 1 liter flask and dissolved in 500 ml of chloroform. The solution was heated to 70° C. and stirred for 5 hours. The solution was cooled down to room temperature and washed with aqueous Na2CO3 solution. The washed organic layer was washed more than 2 times with distilled water and the solvent was completely eliminated. The reaction mixture without the solvent was dissolved in hexane and cooled down to 10° C. to obtain white solids. The solids were filtered and obtained 130 g of the compound represented by formula I.

Synthesis 2—Synthesis of the Polymer Represented by the Structure of Formula II

[Formula II]

[Formula II]

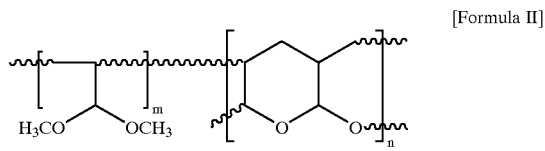

50 g of acrolein and 100 ml of ethyl acetate were added into 250 ml flask and 6 g of AIBN was added and dissolved. The solution was heated to 70° C. and stirred for 12 hours. The solution was cooled down to room temperature and the produced solids were filtered and dried. The dried solids were put into 500 ml flask and 200 ml of methanol and 0.2 g of sulfuric acid were added and stirred at 60° C. for 15 hours. The solution was cooled down to room temperature and neutralized with 0.5 ml of triethylamine. The neutralized solution was slowly dropped into excess distilled water to obtain while solids. The solids were filtered and dried to obtain 58 g of the polymer of the formula II with m value around 0.6.

Synthesis 3—Synthesis of the Polymer Represented by the Structure of Formula III

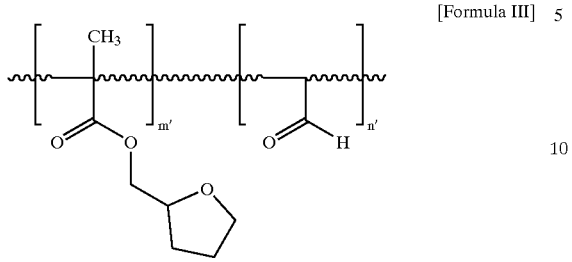

[Formula III]

16 g of tetrahydrofurfuryl methacrylate and 5 g of acrolein were dissolved in 60 ml of isopropyl alcohol. 0.8 g of AIBN was added and heated to 70° C. The solution was stirred for 8 hour at this temperature and cooled to room temperature. The solution was dropped slowly into excess distilled water. The produced solids were dried and obtained 18 g of the polymer of the formula III with m' value around 0.7.

Synthesis 4—Synthesis of the Polymer Represented by the Structure of Formula IV

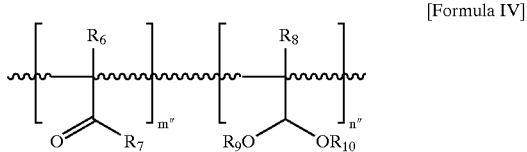

[Formula IV]

100 g of methylacrylate, 100 g of acrolein and 10 g AIBN were dissolved in 400 g of dioxane and the reaction temperature was raised to 70° C. After stirring at this temperature for 15 hours, the unreacted monomer and the solvent, dioxane, were eliminated by vacuum distillation. Into the reactor, 400 g of methanol and 1 g of sulfuric acid were added and reacted for 8 hour at the same temperature. The reactants were cooled down to room temperature and was dropped slowly into excess amount of distilled water. The produced solids were dried and obtained 210 g of the polymer of the formula IV with m" value of 0.4.

Synthesis 5—Synthesis of the Polymer Represented by the Structure of Formula V

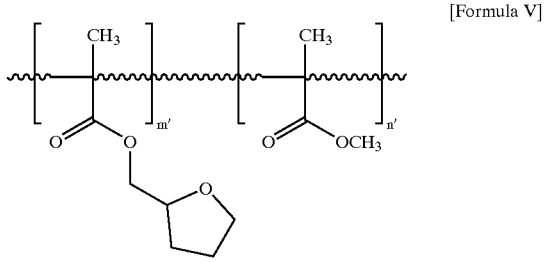

[Formula V]

50 ml of tetrahydrofurfuryl methacrylate and 33 g of methyl methacrylate were dissolved in 100 ml of acetone. After adding 6 g or AIBN, heated to 65° C. and stirred for 6 hours. The reactants were cooled down to room temperature, additional 300 ml of acetone was added to dissolve and the solution was dropped slowly into excess amount of distilled water. The produced solids were dried and obtained 76 g of the polymer of the formula V with m' value of 0.6.

EXAMPLE 1

0.6 g of the polymer obtained in synthesis 2, 0.1 g of the acid generator obtained in synthesis 1 and 0.4 g of polyhydroxystyrene were dissolved in 45 g of propyleneglycol methylether acetate and filtered with 0.2 µm membrane filter to make the composition for the thin film. The composition was spin coated on the substrate and heated at 190° C. for 90 seconds to form the thin film(the anti-reflective film of blocking the light of 193 nm wave length). On the thin film ArF resist was spin coated and heated 90 seconds at 110° C. in order to form multi-layered thin film. The substrate was exposed to light using the ArF eximer laser exposure apparatus and heat treated at 130° C. for 90 seconds. The substrate is cooled down and developed for 40 seconds and washed with 2.38 wt % of aqueous tetraammonium hydroxide solution and dried to form a resist pattern. The produced resist pattern had very good adhesive property and obtained very excellent pattern profile at the resolution of 0.13 µm.

Comparison Example 1

ArF was spin coated on the substrate without the thin film composition and heated at 110° C. for 90 seconds to make thin film. The substrate was exposed to light using the ArF eximer laser exposure apparatus and heat treated at 130° C. for 90 seconds. The substrate is cooled down and developed for 40 seconds and washed with 2.38 wt % of aqueous tetraammonium hydroxide solution and dried to form a resist pattern. The completed pattern had low adhesive property. At less than 0.15 µm pattern, the phenomenon of the patterns being detached is observed and at 0.18 µm resolution, side surface of the pattern profile is observed to be not uniform.

EXAMPLE 2

Carried out the same experiment as described In the Example 1, except using 0.6 g of polymer synthesized in the Synthesis 3 instead of Synthesis 2. The result showed excellent adhesive property of the resist pattern and excellent vertical pattern profile at 0.13 µm resolution.

EXAMPLE 3

Carried out the same experiment as described In the Example 1, except using 0.6 g of polymer synthesized in the Synthesis 4 instead of Synthesis 2. The result showed excellent adhesive property of the resist pattern and excellent vertical pattern profile at the resolution of 0.12 µm.

EXAMPLE 4

Carried out the same experiment as described In the Example 1, except using 0.6 g of polymer synthesized in the Synthesis 5 instead of Synthesis 2. The result showed excellent adhesive property of the resist pattern and excellent vertical pattern profile at the resolution of 0.11 µm.

EXAMPLE 5

Carried out the same experiment as described In the Example 4, except using additionally 50 ppm of fluorinated ether type surfactant. The result showed excellent adhesive property of the resist pattern and excellent vertical pattern profile at the resolution of 0.11 μm.

EXAMPLE 6

2 g of polymer obtained in Synthesis 5 and 0.001 g of the acid generator obtained in Synthesis 1 were dissolved in 50 g of propyleneglycol methylether acetate and filtered by 0.2 μm membrane filter to formulate a thin film composition. The composition was spin coated on a glass substrate and heated at 190° C. for 90 seconds to make the thin film. The completed thin film was homogeneous and formed a coated layer which was not dissolved in usual organic solvents.

EXAMPLE 7

Carried out the same experiment as described In the Example 6, except using additionally 0.2 g of glycerol. The result showed that the completed thin film was homogeneous and it formed a coated layer which was not dissolved in usual organic solvents.

The abovementioned acid generator of the present invention generates acid by heat at a relatively low temperature, preventing the change in the ratio of the composition due to evaporation of some components in the composition. Accordingly it has the advantageous effect that the ratio of components in the composition is controlled and the preparation of the thin film with the wanted properties is simplified.

What is claimed is:

1. The compound represented by the structure of the formula I

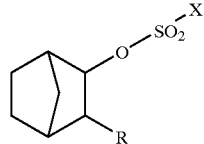

[Formula I]

wherein X is alkyl or aryl group and R is an alkoxy group.

2. A method of synthesizing a compound according to claim 1, wherein an olefin compound or an expoxy compound is reacted with an alkylsulfonic acid or an aryl sulfonic acid.

* * * * *